United States Patent
Longstreth White

(10) Patent No.: US 6,338,777 B1
(45) Date of Patent: Jan. 15, 2002

(54) METHOD AND APPARATUS FOR SPUTTERING THIN FILMS

(75) Inventor: Richard Longstreth White, Los Altos, CA (US)

(73) Assignee: International Business Machines Corporation, Armonk, NJ (US)

( * ) Notice: Subject to any disclaimer, the term of this patent is extended or adjusted under 35 U.S.C. 154(b) by 0 days.

(21) Appl. No.: 09/178,362

(22) Filed: Oct. 23, 1998

(51) Int. Cl.[7] .............................................. C23C 14/34
(52) U.S. Cl. ........................ 204/192.15; 204/192.12; 204/298.08; 204/298.13; 204/298.14
(58) Field of Search ........................ 204/192.12, 192.15, 204/192.16, 298.08, 298.13, 298.14, 298.26

(56) References Cited

U.S. PATENT DOCUMENTS

| | | | |
|---|---|---|---|
| 4,664,976 A | | 5/1987 | Kimura et al. ............... 428/336 |
| 4,869,797 A | | 9/1989 | Nagao et al. .......... 204/192.16 |
| 4,963,239 A | * | 10/1990 | Shimamura et al. ... 204/192.12 |
| 5,045,165 A | | 9/1991 | Yamashita ............. 204/192.16 |
| 5,232,570 A | | 8/1993 | Haines et al. .......... 204/192.16 |
| 5,244,554 A | * | 9/1993 | Yamagata et al. ....... 204/192.2 |
| 5,281,321 A | * | 1/1994 | Stumer et al. ......... 204/298.08 |
| 5,443,888 A | | 8/1995 | Murai et al. ................ 428/143 |
| 5,507,930 A | | 4/1996 | Yamashita et al. ..... 204/192.15 |
| 5,567,512 A | | 10/1996 | Chen et al. ................. 428/332 |
| 5,611,899 A | * | 3/1997 | Maass .................... 204/298.08 |
| 5,679,431 A | * | 10/1997 | Chen et al. ................ 428/65.3 |
| 5,714,044 A | | 2/1998 | Lal et al. ................ 204/192.16 |
| 5,770,023 A | * | 6/1998 | Sellers ..................... 204/192.3 |
| 5,968,328 A | * | 10/1999 | Teschner et al. ....... 204/298.25 |
| 6,096,174 A | * | 8/2000 | Teschner et al. ....... 204/192.12 |

OTHER PUBLICATIONS

E.C. Cutiongco, "Tribological Behavior of Amorphous Carbon Nitride Overcoats for Magnetic Thin–Film Rigid Disks", Journal of Tribology, Jul. 1996, vol. 118, pp. 543–545.

M. Scherer, "Reactive Alternating Current Magnetron Sputtering of Dielectric Layers", pp. 1772–1776, Aug. 1992.

* cited by examiner

Primary Examiner—Nam Nguyen
Assistant Examiner—Steven H. VerSteeg
(74) Attorney, Agent, or Firm—Altera Law Group, LLC

(57) ABSTRACT

Improved apparatus and methods for depositing thin films are described. A sputtering system according to the invention enhances the effects normally achieved with negative voltage bias by having two electrodes driven alternately as anode and cathode by a midfrequency power supply in combination with pulsing a negative bias voltage source for the substrate where the film is being deposited. The invention may be embodied in a multiple disk in-line sputtering system or a single disk sputtering system. Although the invention is potentially useful with any thin film which benefits from being deposited using bias, the described embodiment using the sputtering system according to the invention is for depositing an overcoat on a magnetic disk which is carbon based and includes hydrogen and/or nitrogen.

20 Claims, 3 Drawing Sheets

METHOD AND APPARATUS FOR SPUTTERING THIN FILMS

FIELD OF THE INVENTION

This invention relates to the field of thin film deposition techniques. More particularly the invention relates to sputtering techniques for thin films on magnetic disks and even more particularly to protective overcoats for disks used in data storage devices.

BACKGROUND OF THE INVENTION

Sputtering is the physical ejection of material from a target as a result of ion bombardment of a target mounted on a cathode. The ions are usually created by collisions between sputtering gas atoms, e.g. argon, and electrons in a glow discharge. The ions are accelerated into the target attached to the cathode by the electric field which may be DC, AC or RF. A substrate placed in a suitable location will intercept some of the atoms which have been sputtered off of the target and a thin film coating of target material can be deposited on the substrate. The targets are eroded by this process and must be periodically replaced. In some applications a negative bias voltage is applied to the substrate. This method, termed bias sputtering causes positive sputtering gas ion (e.g. argon ion) bombardment of the coating during its growth, which can have beneficial effects in some applications. Some underlayers and magnetic layers are deposited using bias. The bias used in disk industry sputtering is normally DC. In reactive sputtering, a reactant gas, e.g. a hydrocarbon gas, ammonia, etc., is added to the chamber in addition to the sputtering gas to form one or more compounds with the target material in the deposited film.

In a planar magnetron sputtering system, the cathode assembly includes an array of permanent magnets arranged to form a closed loop magnetic field, commonly referred to as a "race track", which establishes the path or region along which sputtering or erosion of the target material takes place. In a magnetron cathode, the magnetic field confines the glow discharge plasma and increases the path length of the electrons moving under the influence of the electric field. This results in an increase in the gas atom-electron collision probability. This leads to a much higher sputtering rate than that obtained without the use of magnetic confinement. Further, the sputtering process can be accomplished at a much lower gas pressure. Magnetron sputtering can also be used in a so-called dual cathode arrangement where each of the two electrodes can serve as the cathode.

The thin film magnetic recording disk in a conventional drive assembly typically consists of a substrate with several layers of sputtered thin films deposited on both planar sides of the disk. There is typically at least an underlayer consisting a thin film of chromium (Cr), a Cr alloy, or NiP; a cobalt-based ferromagnetic alloy deposited on the underlayer; and a protective overcoat over the magnetic layer. One variation of the layer structure described above uses a very thin initial seed layer on the substrate to establish an appropriate nucleation base for the underlayer.

The protective overcoat serves to inhibit corrosion and reduce stiction between the sliders (or heads) and the disk surface, as well as, to protect the magnetic film from mechanical damage. Numerous materials have been used/proposed for overcoats, but currently carbon based films are commonly found in commercial magnetic disks. Relatively pure amorphous carbon films have been used, but carbon films with significant amounts of hydrogen and/or nitrogen have also been used. The C:Hx films are reactive sputter deposited using graphite targets while introducing hydrogen or hydrocarbon gases into the chamber. DC or RF magnetron sputtering or DC or RF diode sputtering of these films is known. (See, for example, Yamashita 5,045,165). In the context of sputtering a carbon protective film on a magnetic tape, U.S. Pat. No. 4,869,797 describes the use of a bias voltage of −10 V to −100 V being applied "in the vicinity of the support and magnetic layer."

When nitrogen is added gas in the sputtering chamber with graphite targets C:Nx films are produced. In U.S. Pat. No. 4,664,976 Kimura, et al. teach the use of a carbon nitride protective layer deposited by RF sputtering using a carbon target in the presence of nitrogen gas. Kimura, et al. state that the ratio of carbon to nitrogen in the film should be from 4:1 to 3:2. In U.S. Pat. No. 5,567,512 Ga-Lane Chen, et al., describe a carbon based overcoat with a surface density of nitrogen atoms of $3-8\times10^{16}$ atoms/cm$^2$ and a preferred thickness of 80–150 Angstroms. The film is deposited in an atmosphere of argon with 20–40 at. % nitrogen.

Haines, et al., in U.S. Pat. No. 5,232,570 describe a method of sputtering $C_xN_y$ films with 10 to 40 at. % N. The method uses DC magnetron sputtering with 300–1200 V DC on the cathode and ground (or powered anodes) to reduce the electron bombardment of the disk surface.

Yamashita, at al. in U.S. Pat. No. 5,507,930 describe a method for sputtering a C:Hx film to increase the life of the graphite targets by imposing an AC voltage on the DC power supply to the target. Yamashita states that the sputter rate of carbon by RF sputtering is many times lower than DC magnetron sputtering and that RF sputtering has the additional drawback among others of requiring a complex impedance matching network. Yamashita also states that the use of what he calls low frequency RF sputtering in the range of several hundred kilohertz simplifies the matching network, but still has too low of a sputtering rate to be practical.

In U.S. Pat. No. 5,443,888 Murai, et al. describe a method of making a magnetic tape including forming a diamond-like carbon film on a polymer film by a plasma CVD using an 80 to 200 kHz power signal with a peak voltage of more 500 V and a hydrocarbon having at least 3 carbon atoms. Murai states that it is preferable to add a DC voltage of 1000 to 2500 V to the AC voltage.

In U.S. Pat. No. 5,714,044 Bibari, et al., describe a method of making a dual layer overcoat with the upper layer being carbon nitride film for use on magnetic disks. The method includes making the magnetic fields on confronting sides of the substrate have opposite polarities. The patent states that the nitrogen should be 5 to 50 percent of the gas atoms in the chamber.

E. Cutiongco, et al. have described experiments on deposition techniques for carbon nitride overcoat for magnetic disks. ("Tribological Behavior of Amorphous Carbon Nitride Overcoats for Magnetic Thin-Film Rigid Disks," J. of Tribology, July 1996, volume 118, p. 543). They used planar single cathode or dual-cathode systems both of which were configured for dc unbalanced magnetron sputtering. For some experiments the bias was −200 or −250 volts with 10 microsecond pulses at a 20 kHz rate. The other sputtering conditions were 0.5 and 1.0 kW target power, 4 mTorr total gas pressure with nitrogen partial pressure of 0.2 mTorr.

In an article entitled "Reactive alternating current magnetron sputtering of dielectric layers" M. Scherer, et al. state that dielectric layers like Al2O3, SiO2 and Si3Ni4 have been produced using a reactive ac magnetron sputtering process using a two cathode arrangement. The frequency range was 10 to 100 kHz. The article indicates that a frequency above 10 kHz has the advantage of eliminating the well known problem of arcing. In the experimental details, each cathode is connected to one of two floating outputs of a midfrequency 10 kW power supply operating at 40 kHz. Although the article refers to the system as having two "cathodes," it is clearly pointed out that each of these electrodes functions as a cathode only during one half of the cycle and functions as anode during the other half.

SUMMARY OF INVENTION

Improved apparatus and methods for depositing thin films are described. The invention can be used to apply any films which benefit from the application of a negative bias voltage to the substrate which could include underlayers, magnetic layers and protective overcoats for magnetic disks as well as many other thin films. The invention enhances the effects normally achieved with negative bias voltage by connecting a midfrequency power supply across two electrodes in the sputtering system while pulsing a negative bias voltage on the substrate (work piece) where the film is being deposited. The invention increases bias currents relative to DC and RF sputtering which implies an increase in the density of the substrate biasing ions at the substrate. A detailed description will be given of the use of the apparatus and method to deposit an improved carbon based protective overcoat which includes hydrogen (C:Hx) and/or nitrogen (C:Nx) which can be used on a thin film magnetic recording medium. The overcoat is preferably sputtered using a graphite target with nitrogen and/or hydrogen gas being supplied into the sputtering chamber in addition to the sputtering gas.

The pulsing frequency is preferably from 1 kHz to 200 kHz. The midfrequency signal imposed across the two electrodes is preferably from 10 to 400 kHz. The method can be beneficially used with any other films and/or materials for other applications which can be improved by increased density of the substrate biasing ions at the substrate surface.

In one embodiment of the invention in a sputtering system which simultaneously deposits a film on two planar surfaces of a disk, at least one pair of dual electrodes is used on each side of the system. The phases of the power signals to each side of the system are controlled so that confronting electrodes are driven in the same phase to avoid have the confronting electrodes competing with the electrodes on the same side of the system.

DETAILED DESCRIPTION OF THE PREFERRED EMBODIMENTS

The invention will be illustrated by describing a specific embodiment of the method. The details of the embodiment are not meant to imply that the use of the invention is limited to the described embodiment. On the contrary Applicant believes the method and apparatus to be of general applicability in the field of thin film deposition.

Use of the Applicant's method will be described in connection with an improved thin film overcoat for magnetic thin film disks. The typical magnetic disk is sputtered with a plurality of thin film layers before a final protective overcoat is sputter deposited. Use of Applicant's method of mid-frequency sputtering in conjunction with pulsed negative bias voltage on the substrate results in an improved carbon based overcoat. A reactive gas containing hydrogen and/or nitrogen is added to the chamber during sputtering to form C—H and/or C—N bonds in the thin film.

Figure 3:
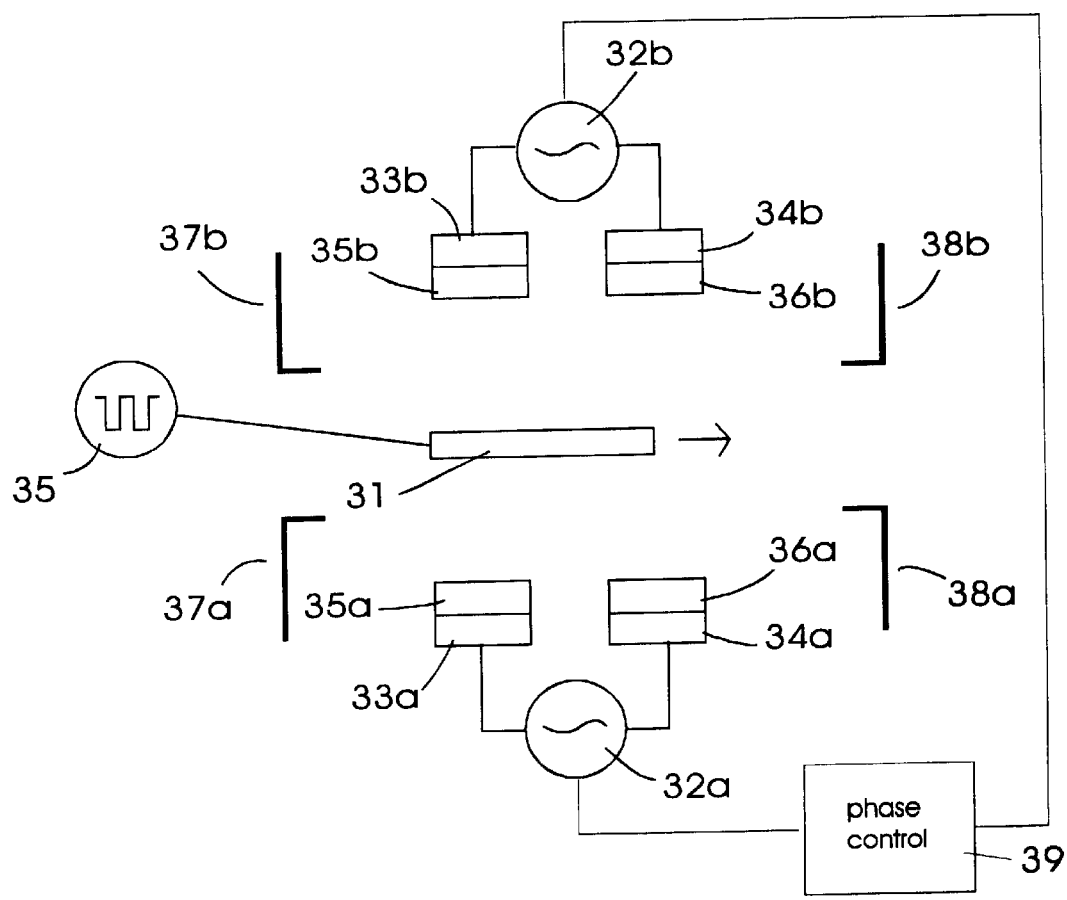
FIG. 3 illustrates a dual electrode sputtering system according to the invention.

FIG. 3 illustrates an embodiment of a sputtering system designed according to the invention. The invention may be embodied in a single disk sputtering system or a so-called in-line sputtering system. The described embodiment will simultaneously deposit a film on both sides of a disk, but the invention can also be utilized in a system which deposits a film only on one surface. The disk substrate 31 is positioned in proximity to symmetrical pairs of sputtering targets 35a, 36a, 35b, 36b which result in simultaneous sputter deposition on both planar surfaces of the disk. The disk may either be stationary during the deposition process or may move past the targets on a conveyor system. The disk is physically supported during sputtering by an electrically conductive holder which does not obscure the planar surfaces on which the films are to be deposited. In an in-line system several disks are sputtered simultaneously by placing them in a rack or pallet which serves as the holder and must also have electrical conduction paths to the substrate for the bias voltage. To sputter a carbon based overcoat according to the invention, standard magnetron graphite sputtering targets can be used as the source of the carbon atoms. The targets are mounted on electrodes 33a, 34a, 33b, 34b. To implement the apparatus of the invention, a midfrequency alternating current (ac) power supply 32a is connected between electrodes 33a and 34a which are positioned on the same side of the sputtering chamber with respect to the pallets. The result is that the adjacent electrodes 33a, 34a are being driven in opposite phase. When one electrode is being driven with a positive voltage as the anode the other electrode in the pair is driven negative as the cathode. The negative voltage bias source 35 is electrically connected to disk or other work piece through the holder, rack and/or pallet. Since it may be desirable to optimize the bias voltage empirically, the bias source preferably should be adjustable to allow the voltage to be selected from approximately 0 to −500 v. The negative voltage bias source 35 is pulsed so that preferably the voltage output is a square wave.

Although the invention could be implemented in a system which sputter deposits on only one surface of a substrate, magnetic disks are typically sputtered on two sides simultaneously. The second side of the chamber is similar to the first with midfrequency power supply 32b connected between electrodes 33b and 34b. The single negative voltage bias source 35 inherently biases the disk substrate as a whole and, therefore, serves for both sides of the disk.

In a preferred embodiment of the invention power supplies are controlled so that confronting electrodes, e.g. 33a and 33b, are driven in opposite phase. In this configuration 33a will be functioning as an anode when 33b is functioning as a cathode. The phase control can be implemented in any convenient manner such as driving the two pairs of electrodes from the same power source, but reversing the polarity for one side. If separate power supplies are used then a phase controller 39 or control means can synchronize the phase of two power supplies which can then be connected with opposite polarities to the two sides. FIG. 3 shows power supply 32*a* in phase with power supply 32*b* under the control of a phase controller 39. If a single power supply is used the phase controller is omitted.

Figure 4:
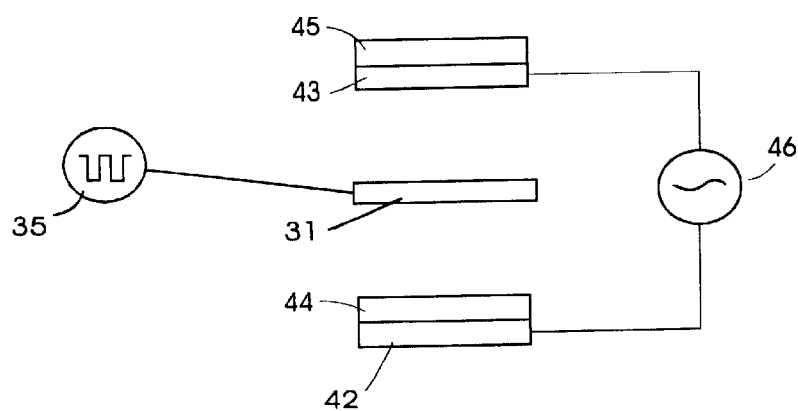
FIG. 4 illustrates an embodiment of the invention in a single disk system with a single electrode with an attached target on each side of the disk.

FIG. 4 illustrates an embodiment of the invention in a single disk system. The system in FIG. 3 is sufficiently large to accommodate a pallet with multiple disks traveling past the targets. A single disk system is inherently smaller and, therefore, the configuration is modified to function with a single electrode with an attached target 44, 45 on each side of the disk. Electrodes 42, 43 are connected to the floating output leads of midfrequency power supply 46, so that electrode 42 is driven as the anode while electrode 43 is the cathode and vice versa during each cycle. The disk 31 in a single disk system will typically remain stationary while sputtering is taking place. No change in the way the disk is biased is required for a single disk system.

It is well known to those skilled in the art that optimum sputtering parameters will vary from system to system and must be determined empirically. Therefore, the parameter values given herein should be interpreted as giving guidance for a typical in-line sputtering system such as those manufactured by Ulvac, but not to represent universally applicable values.

Standard sputtering supply voltages are used; these range from +300 volts to −1500 volts with 800 v peak to peak being a reasonable value. The sputtering power can range from 0.3 kW to 5.0 kW. The sputtering power signal should be a midfrequency signal directly imposed across the two electrodes which is preferably from 10 to 400 kHz. It should be noted that this power supply arrangement is quite different from that used for RF sputtering where the power is capacitively coupled to a single cathode. The midfrequency power supply is directly connected (i.e., without capacitive coupling) across the two electrodes so that each electrode is alternately driven as anode then as a cathode. The floating outputs of a power supply may be used to achieve this configuration.

Shielding is conventionally used in in-line sputtering systems to limit angle of incidence effects, to isolate the targets, etc. The two electrode targets which alternate as anode and cathode in the sputtering process in Applicant's system cannot be shielded from each other. The shields 37*a*, 37*b*, 38*a*, 38*b* can be used to isolate the electrode pairs from the other targets in the system if needed. In commercially available in-line sputtering systems the adjacent electrodes may be separated by shields. It is preferable that these shields be modified or removed in order to function optimally according to the invention. A substantially straight path for ions traveling between first and second electrodes should be free from shields.

The bias to the substrates in an in-line multi-disk system is most conveniently supplied through the pallets which are electrically conductive and make electrical contact with the substrates. The bias is pulsed at a frequency which is preferably from 1 kHz to 200 kHz. The pulses are preferably in the form of square waves. The pulse width is preferably 45 microseconds. The bias voltage is preferably −10 v to −300 v with approximately −50 v as a nominal preferred value.

Standard total sputtering gas pressures may be used, e.g. 1 to 20 mTorr. The partial pressure of the reactive gas(e's), e.g. hydrogen or nitrogen can range from 0.05 mTorr to 6 mTorr, with 0.2 mTorr being a nominal preferred value. The duration of the deposition will depend in part of the desired thickness of the resulting film.

By comparing the current flowing to a pallet during sputtering, Applicant determined that midfrequency sputtering according to the invention significantly increased the current being drawn by the pallet over dc sputtering. The amount of increase over dc sputtering varied with the bias voltage. For example, in one experiment with 3 kW target power at 40 kHz using approximately −100 v pulsed bias, the current was increased by more than a factor of three over the dc case. At higher bias voltages the effect was smaller, but was still about 2x at −200 v pulsed bias. The significance of increased bias current at a given bias voltage is that it implies an increased density of argon ions available at the substrate. Viewed in terms of current density a second experiment using Ar+40% N2 at a total pressure of 5 mTorr and −300 v pulsed bias, the current density for midfrequency sputtering was more than 4 times the dc level.

One measure of merit for an overcoat is hardness. The method of the invention can result in an increase in the nanoindenter hardness of a C:Nx overcoat. Using Ar +25% N2 at a total pressure of 5 mTorr to deposit various 1100A C:Nx films on silicon substrates, more than a factor of two increase in nanoindenter hardness was obtained by using the midfrequency sputtering as compared to DC sputtering with −100 v pulsed bias. The substantial improvement in hardness continued up to −300 v which was the maximum test value in this experiment, but with a rolloff in the improvement starting at approximately 175 v. Improved hardness with midfrequency sputtering was found at all bias levels tested, even at zero bias.

Durability of an overcoat for a disk can be tested by subjecting the overcoat to repeated start/stop cycles wherein the disk is rotated as though in operation in a disk drive and then stopped to cause a slider biased against the overcoat surface to rub over the surface prior to flying above the surface and to rub on the surface when landing as the disk is stopped. More durable overcoats have a higher number of start/stop cycles that the overcoat can sustain prior to a certain level of damage. In a start/stop test of durability, C:Nx overcoats made according to invention with midfrequency sputtering and −100 v pulsed bias were found to survive more than ten times the number of cycles as did C:Nx films made similarly with the exception that no bias voltage was used.

Figure 5:
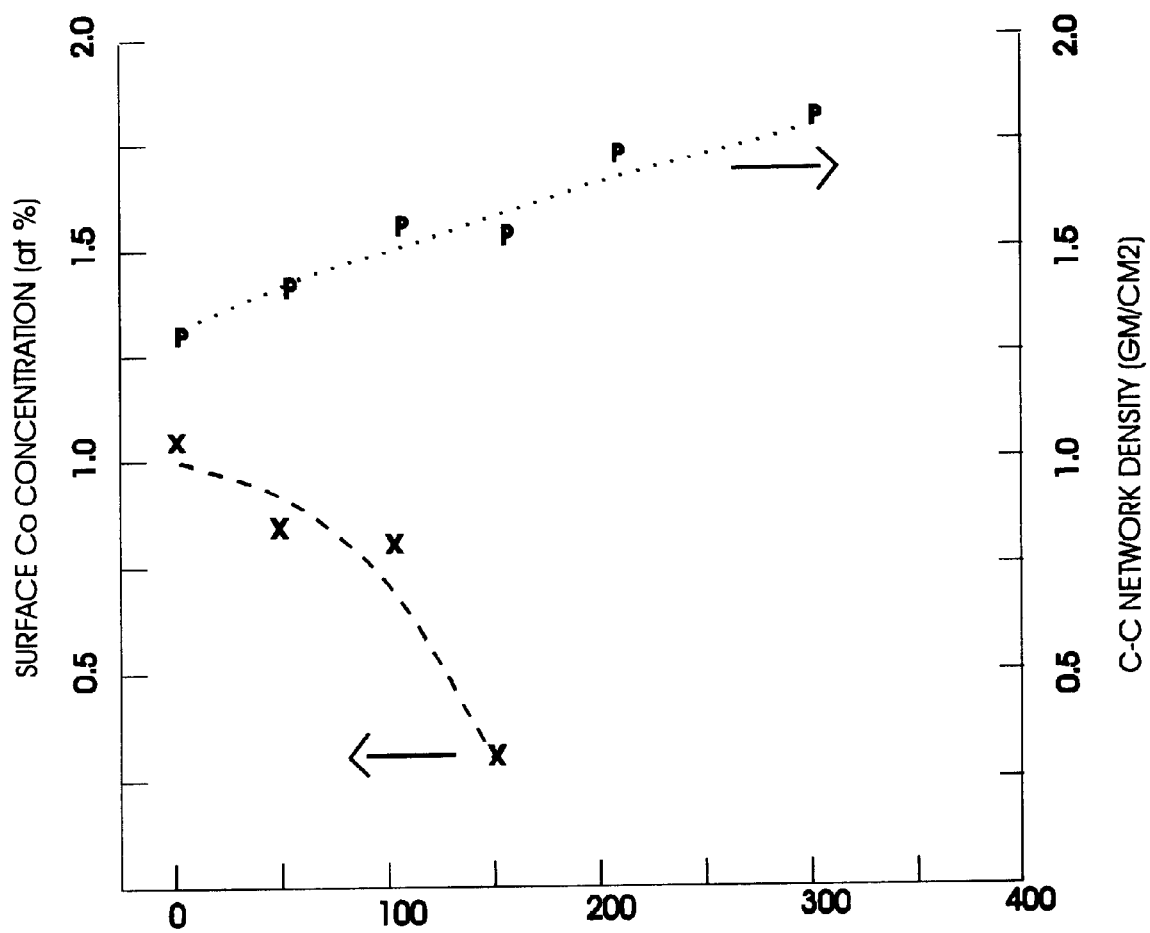
FIG. 5 is a graph of substrate bias voltage versus surface cobalt atom concentration on the left hand vertical axis and C—C network density on the right hand axis for sample C:Nx films prepared according to the invention.

One role for an overcoat on a magnetic disk is to form a barrier which prevents atoms from migrating into or out of the magnetic layer. Since the magnetic layer is typically an alloy of cobalt, the cobalt atom concentration at the surface of the overcoat is a measure of how well the overcoat is serving this function. FIG. 5 is a graph of substrate bias voltage versus surface cobalt atom concentration on the left hand vertical axis and C—C network density (gm/cm2) on the right hand axis for sample C:Nx films prepared according to the invention. The upper line on the graph uses the network density scale on the right hand side and shows that this density increases with increasing negative bias voltage. The lower line on the graph uses the surface cobalt atom density scale on the left hand side and shows that the surface cobalt concentration decreases with increasing negative bias voltage.

The overcoat on a magnetic disk is typically less than 15 nm thick. One advantage of overcoats made according to the invention is that they may be made thinner than prior art overcoats due to the increased durability, hardness, etc. Thinner overcoats are desirable for magnetic disks to allow the heads to be closer to the magnetic layer.

A complete embodiment of a thin film magnetic disk with a protective overcoat according to the invention will be described. The optional seed layer, underlayer and magnetic layer are sputtered according to prior art methods known to those of skill in the art. The seed layer may be included or omitted according to prior art principles. There is minimal interaction between the overcoat and the other layers, so the use of the invention to deposit the overcoat does not particularly constrain the material choices for the other layers. Since the overcoat is typically only in contact with the magnetic layer, any interaction with the overcoat is limited to the magnetic layer and is typically limited to nonmagnetic effects such as corrosion, migration of atoms, etc. Magnetic effects do sometimes occur, but the alloy used for the magnetic layer is not particularly constrained by the use an overcoat according to the invention. The most commonly used magnetic materials for magnetic disks as of the date of this application are alloys of cobalt. Similarly, the underlayer should be expected to have no interaction with an overcoat according to the invention and therefore any underlayer material may be used. Likewise, the choice of seed layer, if any, if not constrained by the overcoat.

In general standard sputtering techniques are used to deposit each of the thin film layers of a disk embodying the invention other than the overcoat.

Figure 2:
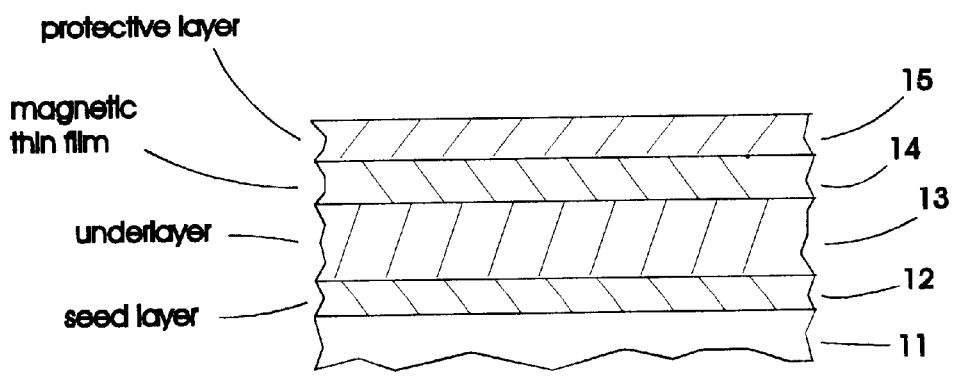
FIG. 2 illustrates the layer structure of a prior art thin film magnetic disk in which the invention can be embodied.

FIG. 2 illustrates the cross sectional layer structure of a prior art thin film magnetic disk with an overcoat embodiment of the invention. The thin film layers will be sputter deposited onto at least one and preferably both planar surfaces of the substrate 11 to form the data recording area of the disk. The shading is used only to differentiate the layers and not to indicate color or specific composition. The invention may be used with any substrate material provided that the bias voltage can be successfully applied which requires that either the material be electrically conducting, e.g. AlMg/NiP or that conducting material be deposited on the substrate material. The seed layer 12 is an optional layer that may be used to improve magnetic properties such as coercivity or crystallographic orientation. The seed layer may be any one of the materials which are known in the prior art to be useful as seed materials.

The thicknesses of the standard seed, under layer 13 and magnetic layer 14 are not believed to be critical for practicing the invention and can be determined according to prior art principles. Therefore, the thickness ranges given below are merely included as illustrative guidance. Typical thickness ranges currently in use are: seed layer between 2 and 50 nm, underlayer between 10 and 80 nm and magnetic layer between 5 and 50 nm. An example of a complete layer structure of a disk embodying the invention would be:

AlMg/NiP—Cr—CoPtCrTa—C:Nx.

There are other possible layer structures for a magnetic thin film disk including those with multiple magnetic layers, additional underlayers, etc. An overcoat sputtered according to the invention can be used with any layer structure.

All of the layers described above from the seed layer to the overcoat can be sputtered in a continuous process in either an in-line sputtering system or a single disk system. The seed layer is deposited first, followed by the underlayer, then the magnetic layer. The last step deposits a protective overcoat 15 according to the teachings of the invention. while the compositions listed above have been given without regard to contamination percentages, it is known to those skilled in the art that some contamination is normally if not always present in thin films. Sputtering targets are typically specified as 99.9% or greater purity, but the resulting films may have much lower purity due to contamination in the sputtering chamber or other factors. For example, contamination by air or water in the chambers might result in measurable amounts of oxygen, nitrogen and/or hydrogen being incorporated into an overcoat film. For some carbon based films 5 at. % hydrogen contamination has been measured in a typical sputtered layer. Contamination levels were not specifically measured in the disk samples described and, therefore, were assumed to be within normal ranges for sputtered thin film disks expected by those skilled in the art.

The thin film disk made according to the invention can be used for storing data in typical disk drives using either magnetoresistive (MR), giant magnetoresistive (GMR) or inductive heads and can be used in contact recording or with flyable heads. The read/write head is positioned over the rotating disk in the standard manner to either record or read magnetic information.

Figure 1:
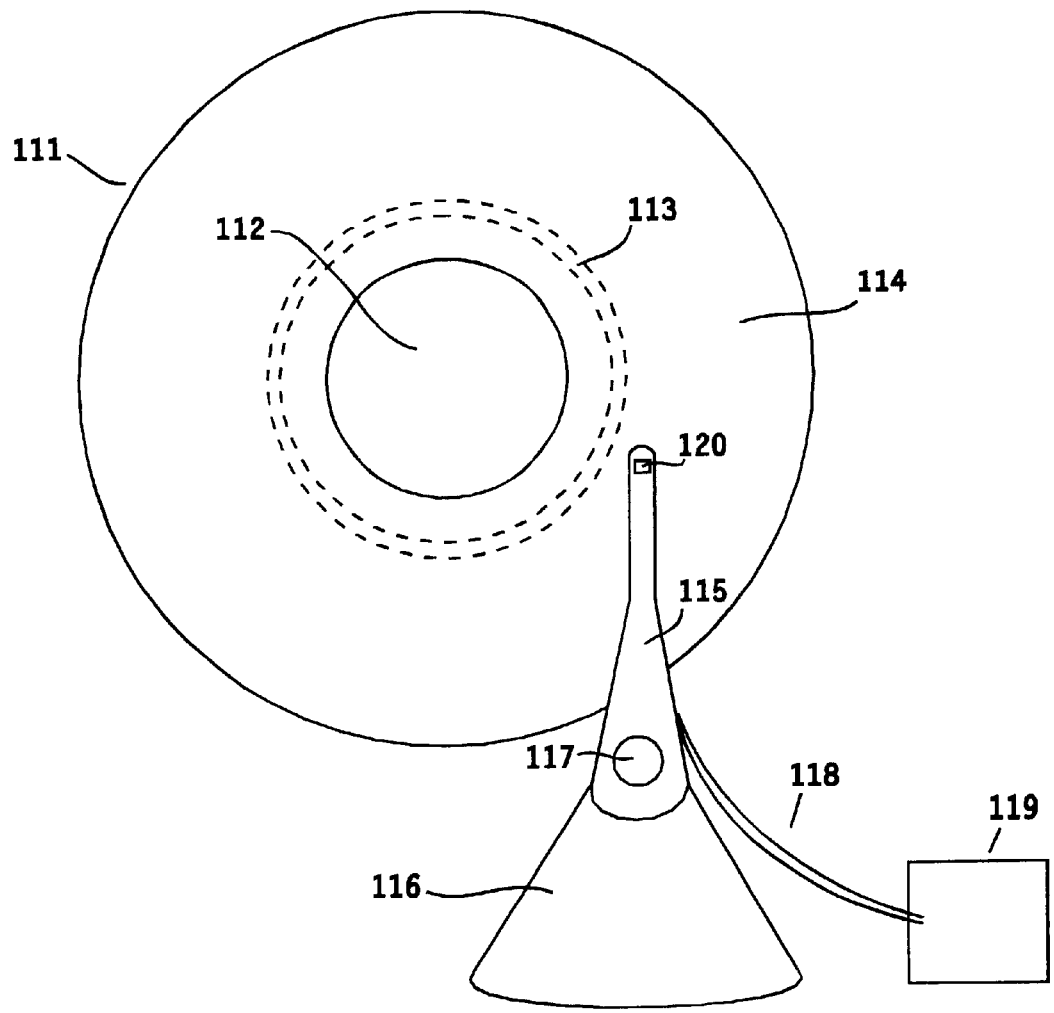
FIG. 1 illustrates a top view of a prior art disk drive with a rotary actuator of the sort in which the disk of the invention can be employed.

The thin film disk of the invention can be used with any magnetic disk drive design. Without implying limitation, FIG. 1 is a top view illustrating a prior art disk drive with a rotary actuator useful in practicing the present invention. The system comprises one or more magnetic recording disks 111 mounted on spindle 112 which is rotated by a spindle motor which is an in-hub electrical motor (not shown). An actuator assembly 115 supports a slider 120 which contains one or more read/write heads. The assembly may be composed of a plurality of actuators and sliders arranged in a vertical stack with the actuators supporting the sliders in contact with the surfaces of the disks when the disks are not rotating or being unloaded to avoid contact. A voice coil motor (VCM) 116 moves the actuator assembly 115 relative to the disks by causing the assembly to pivot around shaft 117. The heads are typically contained in air bearing sliders adapted for flying above the surface of the disks when rotating at sufficient speed. In operation, when the sliders are flying above the disks the VCM moves the sliders in an arcuate path across the disks allowing the heads to be positioned to read and write magnetic information from circular tracks formed in the data area 114 which is coated with the thin films described above. Electrical signals to and from the heads and the VCM are carried by a flex cable 118 to the drive electronics 119. When not operating and during periods when the rotation of the disks is either starting or stopping, the sliders may be positioned in physical contact with the surface of the disks in a landing zone or contact start/stop (CSS ) area 113 which is not used for data storage even though the magnetic coating extends over this area. It is also known to remove the sliders from the disks during nonoperating periods using an unload ramp. Although the disk drive has been described with air bearing sliders the disk of the present invention may easily be used in other storage devices having near contact, or contact recording sliders.

While the preferred embodiments of the present invention have been illustrated in detail, alternative embodiments of the invention are realizable without deviating from the scope and spirit of the invention.

What is claimed is:

1. A method for depositing a thin film comprising the steps of:
   applying a pulsed negative bias voltage to a substrate in a sputtering chamber;
   powering at least first and second sputtering electrodes positioned on a first side of the sputtering chamber with an alternating current power source having a frequency of 10 kHz to 400 kHz connected between the first and second sputtering electrodes to sequentially drive each sputtering electrode as an anode then as a cathode, each of the first and second sputtering electrodes having a sputtering target material attached thereto;

powering at least third and fourth sputtering electrodes positioned on a second opposite side of the sputtering chamber with an alternating current power source having a frequency of 10 kHz to 400 kHz connected between the third and fourth sputtering electrodes to sequentially drive each of the third and fourth sputtering electrodes as an anode then as a cathode, each of the third and fourth sputtering electrodes having the sputtering target material attached thereto;

contemporaneously executing the step of applying a pulsed negative bias voltage to the substrate and the steps of powering the first, second, third and fourth sputtering electrodes, and;

supplying a gas of a first substance to serve as a sputtering gas in the sputtering chamber while powering the sputtering electrodes;

wherein each of the third and fourth sputtering electrodes having a sputtering target material attached thereto and being arranged so that the third sputtering electrode confronts the first sputtering electrode, the powering of the third sputtering electrode occurring to drive the third sputtering electrode as an anode when the first sputtering electrode is being driven as a cathode.

2. The method of claim 1 wherein the pulsed negative bias voltage has a pulsing frequency of 1 kHz to 200 kHz.

3. The method of claim 2 wherein the pulsed negative bias voltage is from 10 to 300 volts.

4. The method of claim 1 wherein the pulsed negative bias voltage is from 10 to 300 volts.

5. The method of claim 1 further comprising the step of supplying a gas of a second substance which generates a component in the sputtering chamber which reacts with the target material and become incorporated into the thin film.

6. The method of claim 5 wherein the target material is carbon and the second substance includes nitrogen.

7. The method of claim 5 wherein the target material is carbon and the second substance includes hydrogen.

8. The method of claim 5 wherein the pulsed negative bias voltage has a pulsing frequency of 1 kHz to 200 kHz, the pulsed negative bias voltage is from 10 to 300 volts, the target material is carbon and the second substance includes nitrogen.

9. A method for sputter depositing a thin film containing carbon and nitrogen onto a substrate having a previously deposited thin film, comprising:

applying a pulsed negative bias voltage to the substrate in a sputtering chamber;

concurrent with the step of applying a pulsed negative bias voltage to the substrate, driving at least first and second sputtering electrodes on a first side of the sputtering chamber with an alternating power supply having a frequency between 10 kHz and 400 kHz, each sputtering electrode having a sputtering target containing carbon attached thereto and driving third and fourth sputtering electrodes in the sputtering chamber with an alternating current power source connected between the third and fourth sputtering electrodes to sequentially drive each of the third and fourth sputtering electrodes as an anode then as an cathode, the driving of the third sputtering electrode occurring to drive the third sputtering electrode as an anode when the first sputtering electrode is being driven as a cathode, the third sputtering electrode being arranged to confront the first sputtering electrode on an opposite side of the sputtering chamber;

supplying a noble gas to serve as a sputtering gas in the sputtering chamber; and supplying a gas containing nitrogen to the sputtering chamber.

10. The method of claim 9 wherein the pulsed negative bias voltage has a pulsing frequency of 1 kHz to 200 kHz and a voltage from 10 volts to 300 volts.

11. The method of claim 9 wherein the pulsed negative bias voltage is a square wave with a pulsing frequency of 1 kHz to 200 kHz and a voltage from 10 volts to 300 volts.

12. The method of claim 9 wherein the pulsed negative bias voltage has a pulse width of approximately 45 microseconds.

13. A sputtering system comprising:

first and second electrodes in a sputtering chamber, wherein the first and second electrodes are disposed on a first side of the sputtering chamber;

third and fourth electrodes disposed on a second side of the sputtering chamber which is parallel to the first side;

a first midfrequency power supply having a frequency of 10 kHz to 400 kHz directly connected between first and second electrodes and a second midfrequency power supply having a frequency of 10 kHz to 400 kHz directly connected between third and fourth electrodes, the first midfrequency power supply alternately drives the first electrode as an anode while driving the second electrode as a cathode then drives the second electrode as the anode while driving the first electrode as the cathode and the second midfrequency power supply alternately drives third electrode as an anode while driving the fourth electrode as a cathode then drives fourth electrode as the anode while driving the third electrode as the cathode; and a pulsed negative voltage source electrically connected to a work piece holder to apply a pulsed negative voltage to the work piece holder contemporaneously with the first and second midfrequency power supplies driving the first, second, third and fourth electrodes;

wherein the third electrode and the first electrode are placed in a confronting position and the first and the second midfrequency power supplies are synchronized to drive the third electrode as an anode when the first electrode is being driven as a cathode.

14. The sputtering system of claim 13 further comprising first and second carbon targets mounted in electrical contact respectively with first and second electrodes.

15. The sputtering system of claim 14 further comprising means for supplying nitrogen containing gas into the sputtering chamber.

16. The sputtering system of claim 14 further comprising means for supplying hydrogen containing gas into the sputtering chamber.

17. The sputtering system of claim 13 wherein the pulsed negative voltage source has a pulsing frequency of 1 kHz to 200 kHz and a voltage from 10 volts to 300 volts.

18. The sputtering system of claim 13 wherein a substantially straight path for ions traveling between first and second electrodes is free from shields.

19. The sputtering system of claim 13 wherein the pulsed negative voltage source produces a square wave voltage function.

20. The sputtering system of claim 13 wherein the first electrode is positioned on a first side of the sputtering chamber and the second electrode is positioned on a second side of the sputtering chamber.

* * * * *